United States Patent
Werkman et al.

(10) Patent No.: US 7,415,319 B2
(45) Date of Patent: Aug. 19, 2008

(54) LITHOGRAPHIC APPARATUS AND DEVICE MANUFACTURING METHOD

(75) Inventors: Roy Werkman, Waalre (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 77 days.

(21) Appl. No.: 11/396,912

(22) Filed: Apr. 4, 2006

(65) Prior Publication Data

US 2007/0233305 A1 Oct. 4, 2007

(51) Int. Cl.
*G06F 19/00* (2006.01)

(52) U.S. Cl. .................. 700/121; 700/95; 716/21; 438/401

(58) Field of Classification Search .......... 700/95, 700/57, 121; 716/21; 356/401; 438/401
See application file for complete search history.

(56) References Cited

U.S. PATENT DOCUMENTS

| | | | | |
|---|---|---|---|---|
| RE36,730 E | * | 6/2000 | Nishi | .......... 250/548 |
| 6,803,592 B2 | * | 10/2004 | Yoshida | .......... 250/548 |
| 6,826,743 B2 | * | 11/2004 | Park et al. | .......... 716/21 |
| 7,031,794 B2 | * | 4/2006 | Cheng et al. | .......... 700/121 |
| 7,226,797 B2 | * | 6/2007 | Tong et al. | .......... 438/5 |
| 7,229,566 B2 | * | 6/2007 | Matsumoto et al. | .......... 216/60 |
| 7,230,705 B1 | * | 6/2007 | Yang et al. | .......... 356/401 |
| 7,298,481 B2 | * | 11/2007 | Mieher et al. | .......... 356/401 |
| 2005/0122516 A1 | * | 6/2005 | Sezginer et al. | .......... 356/401 |
| 2005/0147902 A1 | | 7/2005 | Van Der Schaar et al. | |
| 2006/0265097 A1 | * | 11/2006 | Roberts et al. | .......... 700/121 |

OTHER PUBLICATIONS

Partial European Search Report issued in European Application No. 07251283.3-1226 dated Jul. 24, 2007.

* cited by examiner

*Primary Examiner*—Alexander J Kosowski
(74) *Attorney, Agent, or Firm*—Pillsbury Winthrop Shaw Pittman LLP

(57) ABSTRACT

Correcting for misalignment of a substrate before it is exposed is performed using offset corrections and process corrections that are calculated based on alignment offset measurements of alignment marks and overlay measurements of overlay targets on substrates in previous batches.

14 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a method for manufacturing a device. In particular, it refers to process and alignment corrections of batches of substrates exposed by the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

One feature of a lithographic apparatus is the precision with which it exposes each resist layer of the same substrate such that all layers on the same substrate are aligned. In order to align the layers of a substrate, the table that holds the substrate must be controlled such that the substrate itself is aligned in the same place for every exposure. The same set-up is used for several batches of substrates, and so the alignment of a batch of substrates must also be the same for each substrate and each layer of each substrate in order for a specific exposure set-up to expose all of the layers of all of the substrates precisely in the same manner.

The way that alignment is carried out is that each layer on a substrate includes a number of sets of alignment marks that define the position and shape of the substrate. This position and shape are described by a mathematical model. Generally, more alignment marks are used than are needed to describe the model and so there is residual mark data. Alignment of the substrate layers is successful when a layer being applied for exposure (the "exposure layer") is positioned accurately on top of previous layers. When alignment strategy is not successful, overlay errors occur and less satisfactory exposed patterns on the substrates are created, which may make the resultant IC, etc., not work as well, or the substrate and all its layers may have to be redone if the overlay error is serious enough. This reduces throughput of satisfactorily exposed substrates.

During the alignment of a substrate, the possibility exists to choose from different mark types, different beam colors (or wavelengths) and different diffraction orders to be diffracted from the alignment mark. All these different possibilities give different misalignment results. During measurement of the marks, a decision is made as to which mark type, how many marks, which beam color, and which diffraction order to use.

Overlay measurement or metrology occurs outside of a lithographic apparatus in a dedicated overlay metrology tool. After the substrates are exposed and each, a predetermined number, or all of the resist layers on the substrate are developed, a batch of substrates is sent to the overlay metrology tool and a number of the substrates has their overlay measured. There are several ways to measure overlay errors. Most involve the use of a set of overlay targets or marks that are present in the resist layer and in a previous layer and the relative positioning of the two is measured by reflecting/diffracting a radiation beam from the superposed marks. These overlay marks may be separate from alignment marks, or the same marks may be used for both purposes. If two layers containing marks are perfectly aligned, when an overlay metrology beam is directed onto the mark, the diffracted beam will show no misalignment or overlay of the marks. The marks may include a grating or a periodic array of structures. Misalignment of superposed marks causes variations to the diffracted beam. The extent of the misalignment of the marks (e.g. the gratings) causes an equivalent extent of variation to the diffracted beam. The calculated misalignment values may be stored in a library and future misalignment values compared with these library values to determine the extent of the overlay error. When the library contains enough data, misalignment values can be lined to overlay errors without having to recalculate the image created by the diffraction beam, as the library will contain all the data required.

In the state of the art, the same number of alignment marks (e.g. 16 pairs) is used for each batch of substrates. To compensate for fluctuation in alignment, there are occasional alignment adjustments that are made on the substrates so that the alignment marks are in alignment with alignment marks of previous layers. "Process corrections" (of which alignment corrections form part) are made bespoke to the alignment model for each batch. For example, if a specific lithographic apparatus has a tendency to cause a slight clockwise rotation during exposure of the substrates, the alignment model for that apparatus may incorporate a counterclockwise rotation. The process correction is based on previous batches that have been exposed by that lithographic apparatus.

Problems with the state of the art arise when some substrates have different numbers of alignment marks or alignment marks in different places from other substrates, or if a misalignment is so extreme that the alignment information available from the alignment marks is insufficient to determine the process correction or alignment correction required. Process corrections are dependent on the alignment of the same marks and so if an alignment mark is missing or in a different place, the adjustment controller does not have the correct input information and may therefore be made in respect to the wrong marks. For example, if all previous batches of substrates had 16 pairs of marks and a substrate is included that only has 14 pairs of marks, the controller tries to make its calculations to adjust the position of the substrate with an algorithm made for 16 pairs, but with the input of only 14 pairs. Process corrections are therefore not only difficult to calculate, but a correction may be made that in fact makes the alignment worse because the input information was wrong.

SUMMARY OF THE INVENTION

Features of the invention include determining process corrections to be made to the alignment of each substrate and of each layer of each substrate.

In an embodiment, there is provided a method of aligning and exposing a substrate, including measuring variations in overlay of an alignment mark on at least one previous batch of substrates; calculating a process correction for the substrate by summing the weighted overlay variations of alignment marks for at least one previous batch of substrates; applying the process correction to the alignment of the substrate; and exposing the substrate.

In another embodiment, there is provided a method of aligning and exposing a substrate, including providing an model based on an ideal substrate including an alignment mark with a default position; measuring, for the alignment mark of the number of previous batches of substrates, the offset from the default position; calculating an alignment mark offset for the substrate by summing the weighted measured offsets for the previous batches of substrates; applying the calculated offset to the alignment of the substrate; and exposing the substrate.

DETAILED DESCRIPTION

Figure 1:
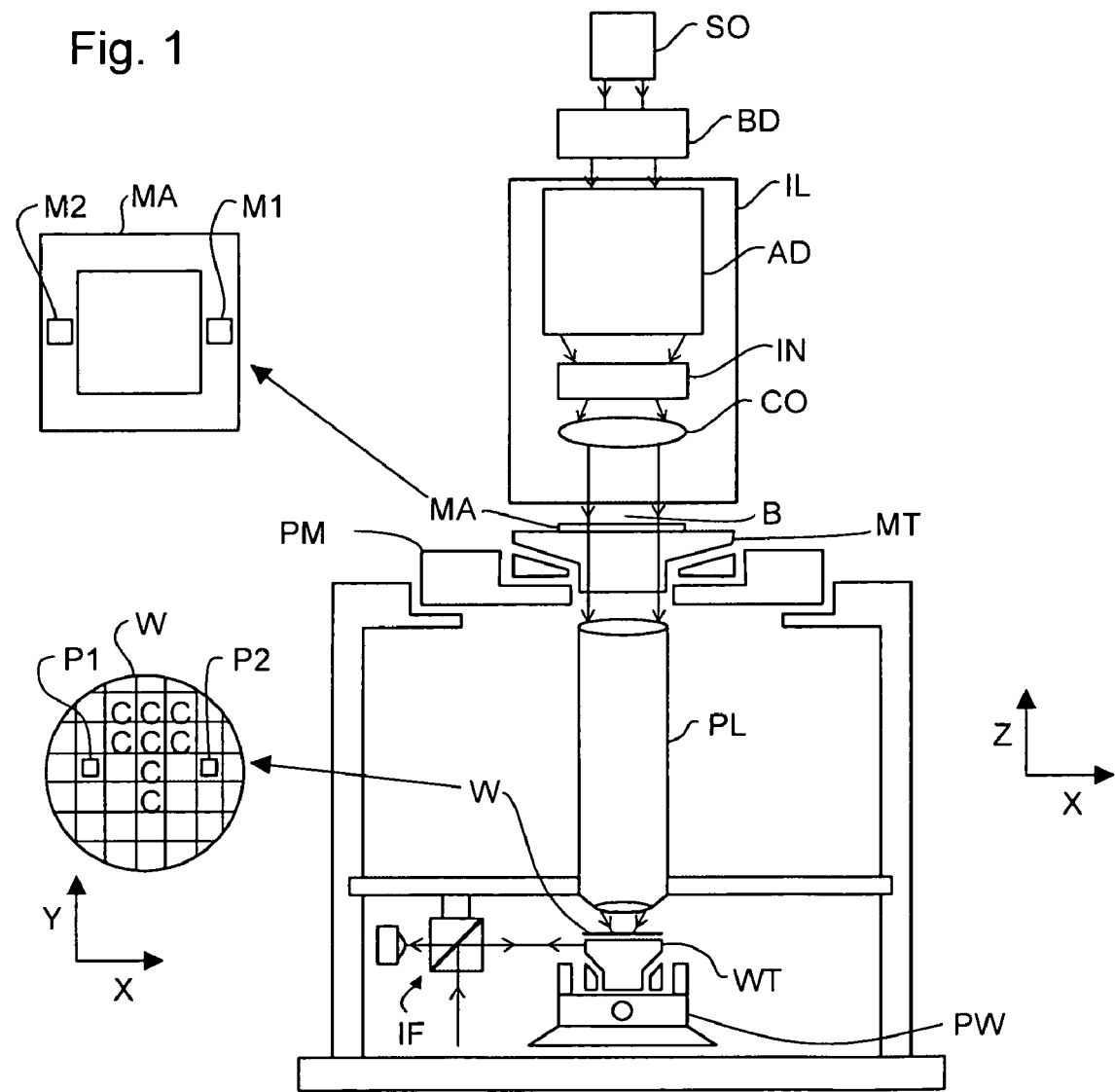
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PL is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, for example after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A known method of correcting alignment is described above and includes the creation of a process correction based on the measurement of overlay errors in previous batches of substrates. The present invention, on the other hand, creates an alignment correction (known as a residual offset correction) based on the measured offsets of alignment marks of previous batches of substrates with respect to a default model. The difference between the invention and the prior art is that process corrections in the prior art are used to change the values of an alignment model, whereas the invention proposes a method with which an offset with respect to a default model can be determined in case a different alignment mark type, number, color or order is used.

In general, each batch of substrates that is exposed by the projection system is exposed according to an alignment strategy based on a mathematical model ideal of a substrate shape and position. However, each batch of substrates, and indeed a whole series of batches of substrates, may have a fixed set of process corrections applied to the alignment strategy to compensate for artifacts in particular lithographic apparatuses. For example, a particular lithographic apparatus may expose substrates with a slight misalignment in the X-axis and so a process correction will be applied to the model so that the lithographic apparatus exposes substrates with a slight movement the opposite way in the X-axis. The problem with a fixed set of process corrections is that they do not necessarily coincide with the alignment strategy in cases where anomalies occur, such as a different number of alignment marks being present on different batches of substrates.

For a particular lithography machine, or a particular set of machines that are to expose the same types of substrates in the same way according to a specific design, a model is created that represents the ideal substrate. There are generally two types of models used: a 6-parameter model (incorporating X-position, Y-position, X-rotation, Y-rotation, X-magnification (or expansion) and Y-magnification); or a simpler 4-parameter model (incorporating position, rotation and magnification, but not separating the X and Y directions, just the X and Y positions). Models may define any number of parameters relevant to the positioning of the substrate in the lithography apparatus with respect to the projection system that will impart the patterned exposure beam.

There are certain position values that are not part of the model, or that cannot be modeled. These position values are known as alignment residuals. An offset in the measured substrate of the alignment residual compared with an ideal is known as a measured residual offset. Correcting for this offset is known as a residual offset correction, which is a type of alignment correction. The alignment residuals are calculated from measurement noise and substrate deformation or variation in substrate shape. Different models will incorporate different alignment residuals depending on different assumptions, such as whether the substrate is bent or straight. The measured residual offsets may be the average residuals of each batch of substrates. These averages are stored and used for correction when a substrate is provided that is found to have an offset.

Each time a substrate is introduced into a machine for exposure, it is also determined whether a different type of process correction is required. A process correction may be calculated based on an average model correction applied to each batch of substrates. A reason for requiring a process correction may be to compensate for differences between lithography machines running the same program. Some lithography machines expose substrates slightly differently from others, for example with a slight rotation or translation in the exposure pattern.

Process corrections in the prior art for each substrate are based on the assumption that all alignment marks on the substrate are used for alignment. When this is not the case, an error may occur. This is where the further residual offset correction helps to prevent further errors in the exposure, by allowing for changes in alignment marks.

Figure 2:
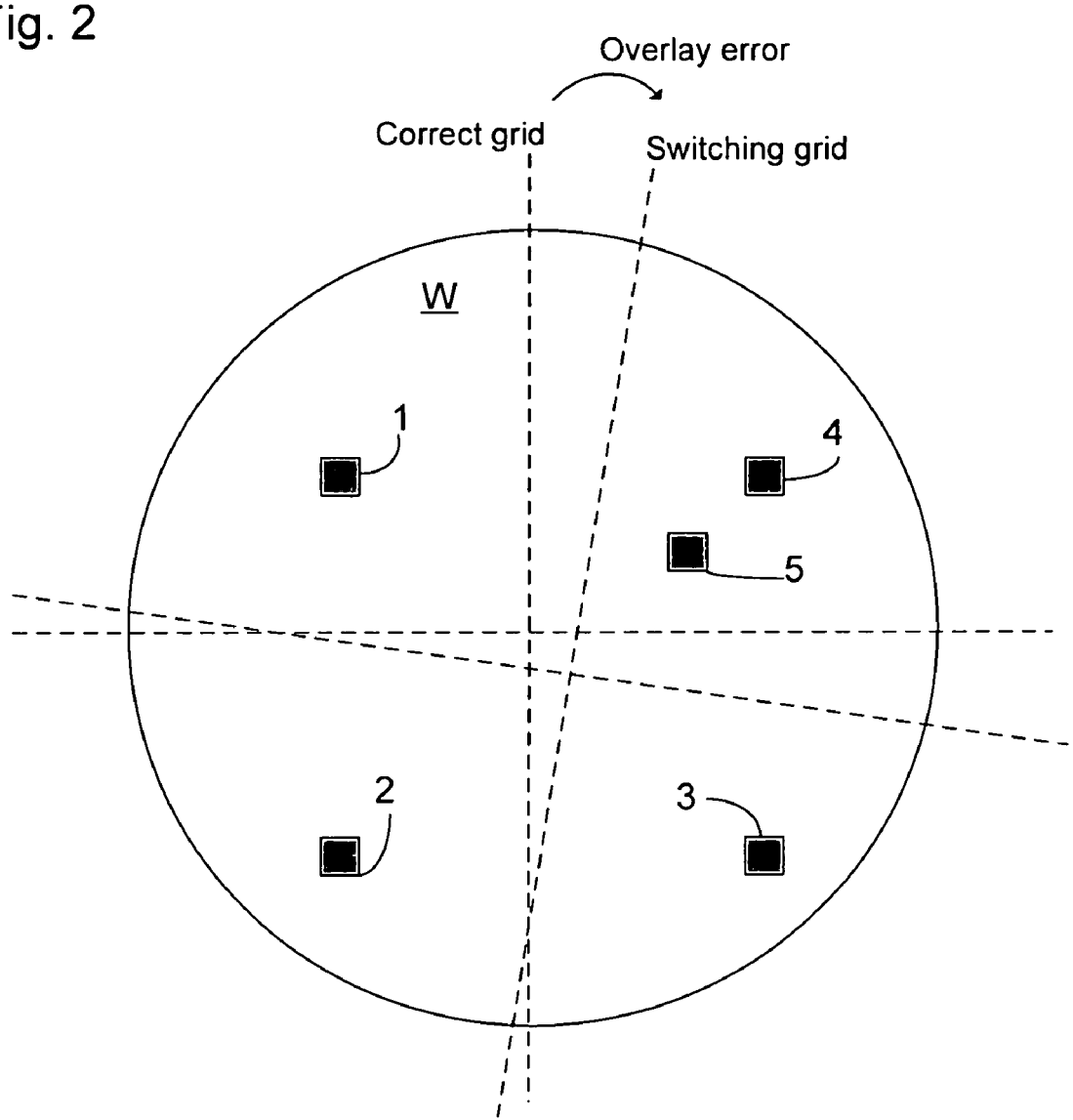
FIG. 2 depicts a lithographic apparatus according to another embodiment of the invention.

FIG. 2 shows a substrate W with standard substrate alignment marks 1, 2, 3, 4 and 5. The default alignment marks are 1, 2, 3 and 4. This gives an alignment shown by the dotted cross that is labeled "correct grid"; i.e. the default grid. A grid is a two-dimensional representation of the mathematical model described above. If a substrate is introduced with alignment mark number 4 failing alignment, mark number 5 may be used instead as a back-up mark. The information related to mark number 5 is stored in the controller for corrections in case this happens. In the example shown, the lithographic apparatus in question rotates the exposure pattern clockwise and also shifts the pattern in both the X and Y directions with respect to the model substrate orientation. The substrate alignment is shown by the dotted cross labeled "switching grid"; i.e. the grid in which marks other than the default marks are used. This switching grid is used because the alignment marks are no longer in the same place as the default marks. For marks 1, 2 and 3, the misalignment may be correctable using process corrections or, more specifically, alignment corrections, but for mark 4, the misalignment may be too great.

Figure 3:
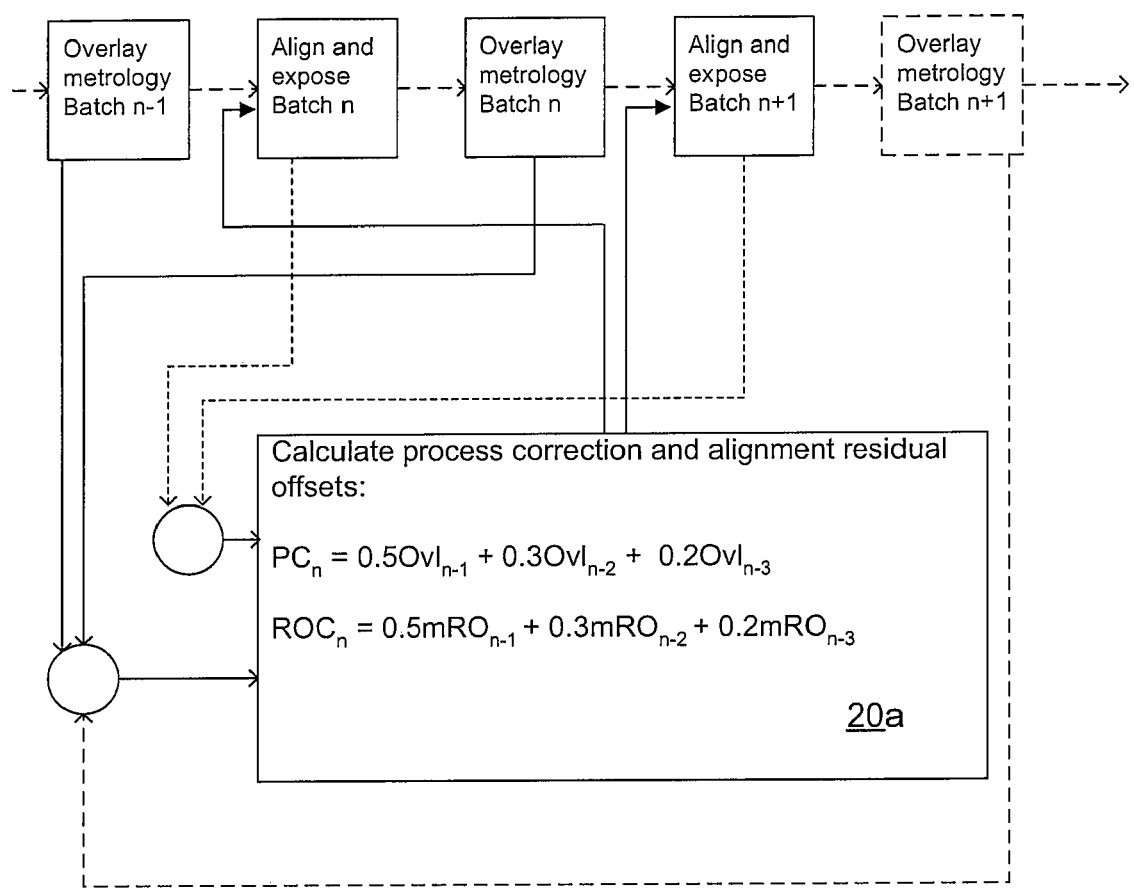
FIG. 3 depicts a mode of transferring a pattern to a substrate using an embodiment of the invention as shown in FIG. 2.

The way in which the process corrections (and the alignment corrections) are determined for variations in alignment marks in different batches of substrates is shown in FIG. 3. The overlay metrology is determined for each batch of substrates. This is done for a series of batches from, for example, n-3 to n. A batch of substrates may have a single layer of resist exposed before being introduced to the overlay metrology tool, and then be reintroduced into the lithographic apparatus so that each batch n-3 to n is, in fact, the same batch with a different number of exposed layers. The extent of overlay errors in a number of substrates from each batch is measured and input into the control system 20. Subsequently to each overlay metrology inspection of each batch, the alignment(s) and exposure(s) are carried out of the subsequent batch. Once this subsequent batch (for example, batch n) has been aligned and exposed, its overlay is measured. The overlay metrology data along with alignment data from the alignment and exposure for each batch is input into the control system 20. As an example, the control system may calculate process corrections and alignment residual offsets as follows before returning process corrections and residual offsets to the subsequent "align and expose" processes for the subsequent batch (for example, batch n+1):

$$PC_n = 0.5 OvI_{n-1} + 0.3 OvI_{n-2} + 0.2 OvI_{n-3} \quad (1)$$

$$ROC_n = 0.5 mRO_{n-1} + 0.3 mRO_{n-2} + 0.2 mRO_{n-3} \quad (2)$$

where $PC_n$=process correction of batch n; $OvL_n$=measured overlay of batch n; $ROC_n$=residual offset correction of batch n $mRO_n$=measured residual offset of batch n.

The alignment data from the alignment and exposure that goes into the control system 20 may contain alignment data of a set of alignment marks, orders and/or colors specified in the active grid (i.e. the default or "correct" grid being presently used as a reference for all offsets). The measurement of these extra marks is only necessary on substrates that are being measured on the overlay metrology tool because only these substrates will be used for determining process corrections.

The residual offset information that is supplied to the projection system for the exposure of the substrate layer contains information such as whether a mark has been rejected or added or has changed place. This allows for a more efficient alignment and exposure such that the alignment of layers on a substrate is improved. This is evidenced by the measured overlay error being reduced.

The process correction and residual offset correction are calculated by summing respectively weighted measured overlays of previous batches and weighted measured residual offsets of previous batches respectively, as shown in FIG. 3. The overlay metrology of the layers on the substrates is discussed above. Of course, the alignment residuals may include information related to any of the different types of alignment marks.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of aligning and exposing a substrate containing alignment marks configured to be used to align subsequent exposure layers of the substrate, the method comprising:
    calculating residual offsets based on a difference between actual alignment mark data and a default model of alignment mark data for each substrate in a batch, the batch comprising a plurality of substrates;
    determining a mean value of the residual offsets for the batch of substrates;
    calculating an alignment correction based on the mean value of the residual offsets to correct calculated residual offsets of the substrate;
    applying the alignment correction to the substrate; and
    exposing the substrate.

2. A method according to claim 1, wherein the default model of alignment mark data comprises a mathematical model of an expected substrate shape and position.

3. A method according to claim 1, wherein the actual alignment mark data comprises data on actual substrate shape and position based on relative positions of the alignment marks with respect to default positions of the default model and with respect to the other alignment marks.

4. A method of aligning and exposing a substrate, comprising:
    calculating an alignment model based on default substrate position and shape values;
    measuring variations in overlay of alignment marks on each substrate in at least a first batch of substrates with reference to the alignment model;
    determining a mean value of the variations in overlay for at least the first batch of substrates;
    calculating residual offsets based on a difference between actual alignment mark data and the default data of the alignment model for each substrate in at least the first batch;
    determining a mean value of the residual offsets for at least the first batch of substrates;
    calculating a correction for the substrate position and shape based on the mean values of the variations in overlay and residual offsets of at least the first batch of substrates;
    applying the correction to the alignment model of the substrate; and
    exposing the substrate.

5. A method according to claim 4, wherein a plurality of previous batches of substrates are used and a greater weighting is given to batches of substrates that have been more recently exposed.

6. A method according to claim 4, wherein, if the measured overlay variation is larger than a predetermined threshold, the alignment mark being measured is rejected and an alternative alignment mark is used.

7. A method according to claim 4, further comprising:
    measuring variations in overlay of alignment marks on each substrate in a second batch of substrates with reference to the alignment model;
    determining a mean value of the variations in overlay for the second batch of substrates;
    calculating residual offsets based on a difference between actual alignment mark data and the default data of the alignment model for each substrate in the second batch;
    determining a mean value of the residual offsets for the second batch of substrates;
    calculating corrections for the substrate position and shape based on a difference between the mean values of the variations in overlay and residual offsets of the second batch and the mean values of at least the first batch;
    applying the corrections to the alignment model of the substrate; and
    exposing the substrate.

8. A method of aligning and exposing a substrate, comprising:
    providing a model based on a default substrate comprising at least one alignment mark with a default position;
    measuring, for at least one alignment mark of a number of previous batches of substrates, the offset of the at least one alignment mark from the default position to give a measured offset;
    calculating an alignment mark offset for the substrate by summing weighted measured offsets for the alignment marks of the number of previous batches of substrates;
    comparing the calculated alignment mark offset and a predetermined threshold of the model;
    applying the calculated alignment mark offset to the substrate; and
    exposing the substrate.

9. A method according to claim 8, wherein measuring the offset from the default position comprises measuring properties of at least two frequencies of radiation diffracted from a surface of the alignment mark.

10. A method according to claim 8, wherein the alignment mark is a grating and calculating the alignment mark offset comprises measuring the properties of at least two diffraction orders of an alignment radiation beam diffracted from a surface of the grating.

11. A method according to claim 8, wherein a plurality of previous batches of substrates are used and a greater weighting is given to batches of substrates that have been more recently exposed.

12. A method according to claim 8, wherein data regarding an alternative alignment mark is included in the calculations of the alignment offset.

13. A method according to claim 8, wherein if the calculated alignment offset is larger than a predetermined threshold, the at least one alignment mark being measured is rejected and an alternative alignment mark data is used.

14. A method according to claim 8, wherein the model comprises an alignment model with a default X-position, Y-position, X-rotation, Y-rotation, X-magnification and Y-magnification.

* * * * *